(12) United States Patent
Yasui

(10) Patent No.: US 6,711,705 B1
(45) Date of Patent: Mar. 23, 2004

(54) METHOD OF ANALYZING A RELIEF OF FAILURE CELL IN A MEMORY AND MEMORY TESTING APPARATUS HAVING A FAILURE RELIEF ANALYZER USING THE METHOD

(75) Inventor: Takahiro Yasui, Tokyo (JP)

(73) Assignee: Advantest Corporation, Tokyo (JP)

( * ) Notice: Subject to any disclaimer, the term of this patent is extended or adjusted under 35 U.S.C. 154(b) by 439 days.

(21) Appl. No.: 09/621,326

(22) Filed: Jul. 21, 2000

(30) Foreign Application Priority Data

Jul. 21, 1999 (JP) ............................. 11-205663

(51) Int. Cl.[7] ............................................. G11C 29/00
(52) U.S. Cl. ........................... 714/723; 714/42; 365/201
(58) Field of Search ......................... 714/723, 42, 724, 714/727, 710; 365/222, 201; 324/760; 710/260, 10, 5; 345/519; 712/245

(56) References Cited

U.S. PATENT DOCUMENTS 4,736,373 A * 4/1988 Schmidt ....................... 371/10
5,410,687 A * 4/1995 Fujisaki et al. .............. 395/575
6,408,401 B1 * 6/2002 Bhavsar et al. ................. 714/7
6,550,023 B1 * 4/2003 Brauch et al. ................. 714/42

* cited by examiner

*Primary Examiner*—Albert Decady
*Assistant Examiner*—Dipakkumar Gandhi
(74) *Attorney, Agent, or Firm*—Gallagher & Lathrop; David N. Lathrop, Esq.

(57) ABSTRACT

A method and apparatus for analyzing repair of failure cells in a memory are capable of detecting an address of a failure memory cell in a short time. The memory testing apparatus includes a failure relief analyzer for testing a memory having a plurality of storage areas, counting the number of failure memory cells for each storage area, and reading out the counted number of failure memory cells. The apparatus has an analyzed storage area detector for searching whether a failure memory cell exists and determining whether a failure relief analysis should be performed, a failure line searching apparatus for searching row addresses to detect whether a failure memory cell exists, and an address scanning apparatus whose operation is started when the failure line searching apparatus detects the presence of a failure memory cell, and for detecting a column address in the direction orthogonal to the row address line on which the detected failure memory cell exists.

5 Claims, 8 Drawing Sheets

| STORAGE AREA ADDRESS | ROW ADDRESS | COLUMN ADDRESS |
|---|---|---|
| A | $R_{N1}$ | $C_{N1}$ |
| A | $R_{N2}$ | $C_{N2}$ |
|  |  |  |
| ⋮ | ⋮ | ⋮ | ial amplitude reference voltage source 121, the comparison reference voltage source 122, and the device power source 123 are also connected to the main controller 111.

METHOD OF ANALYZING A RELIEF OF FAILURE CELL IN A MEMORY AND MEMORY TESTING APPARATUS HAVING A FAILURE RELIEF ANALYZER USING THE METHOD

BACKGROUND OF THE INVENTION

1. Field of the Invention

The present invention relates to a memory testing apparatus for testing various kinds of semiconductor memories including a memory being constructed by, for example, a semiconductor integrated circuit (hereinafter, referred to as IC) and a method of analyzing a relief or repair of failure cell or cells in a memory, which includes the steps of counting the number of failure memory cells of a semiconductor memory tested by this memory testing apparatus and determining whether or not a repair of the tested semiconductor memory is possible. (Hereinafter, a memory being constructed by a semiconductor integrated circuit is referred to as IC memory.) More particularly, the present invention relates to a method of analyzing a repair of failure cell or cells in a memory, which includes the step of specifying an address of a failure memory cell in a memory of redundancy structure in a short time and a memory testing apparatus having a failure relief analyzer using this analyzing method.

2. Description of the Related Art

Recently, an IC memory is being increased in its memory capacity and miniaturized in its size, and accompanied therewith, a defect rate in IC memories have been increased. In order to decrease the defect rate, in other words, in order to prevent the yield of IC memories from being lowered, there are manufactured IC memories in each of which, for example, one or more failure memory cells can be electrically replaced by a substitute or alternative memory cell (also called a spare line, relief line or redundancy circuit in this technical field). The IC memories of this kind each having substitute or alternative memory cells (hereinafter referred to as spare line) is called a memory of redundancy structure in this technical field, and a decision as to whether the redundancy-structured memory can be relieved or not is rendered by a failure relief analyzer.

FIG. 5 is a block diagram showing, in outline, a configuration of the general memory testing apparatus having a failure relief analyzer, which has conventionally been used. This memory testing apparatus TES comprises, roughly speaking, a main controller 111, a pattern generator 112, a timing generator 113, a waveform formatter 114, a logical comparator 115, a driver 116, an analog level comparator (hereinafter referred to as comparator) 117, a failure analysis memory 118, a failure relief analyzer 120, a logical amplitude reference voltage source 121, a comparison reference voltage source 122 and a device power source 123. Further, in the following description, a case that the memory testing apparatus will test IC memories will be described. In case of testing various kinds of semiconductor memories other than IC memories by the memory testing apparatus, however, they will be tested in similar manner.

The main controller 111 is generally constituted by a computer system, in which a test program PM created by a user (programmer) is stored in advance, and the entire memory testing apparatus is controlled in accordance with the test program PM. The main controller 111 is connected, via a tester bus BUS, to the pattern generator 112, the timing generator 113, the failure analysis memory 118, the failure relief analyzer 120 and the like. Although not shown, the An IC memory to be tested (IC memory under test, generally called MUT) 119 is mounted on a IC socket of a test head (not shown) constructed separately from the memory testing apparatus proper. Usually, a member called a performance board is mounted on the upper portion of the test head, and a predetermined number of IC sockets are mounted on the performance board. Accordingly, the IC memory under test 119 is mounted on associated one of the IC sockets. In addition, a printed board called pin card in this technical field is accommodated inside the test head. Usually, a circuit including the driver 116 and the comparator 117 of the memory testing apparatus TES is formed on this pin card. In general, the test head is mounted on a test section of an IC transporting and handling apparatus called handler in this technical field, and is electrically connected to the memory testing apparatus proper by signal transmission means such as a cable, an optical fiber or the like.

First of all, before the test of an IC memory is started, various kinds of data are set by the main controller 111. After the various kinds of data have been set, the test of the IC memory is started. When the main controller 111 gives a test starting instruction or command to the pattern generator 112, the pattern generator 112 starts to generate a pattern. The pattern generator 112 supplies test pattern data to the waveform formatter 114 in accordance with the test program PM. On the other hand, the timing generator 113 generates a timing signal (clock pulses) for controlling operation timings of the waveform formatter 114, the logical comparator 115 and the like.

The waveform formatter 114 converts the test pattern data supplied from the pattern generator 112 into a test pattern signal having a real waveform. This test pattern signal is applied to the IC memory under test (hereinafter referred to as memory under test) 119 via the driver 116 that amplifies the voltage of the test pattern signal to a waveform having an amplitude value set by the logical amplitude reference voltage source 121. The test pattern signal is stored in a memory cell of the memory under test 119 having an address specified by an address signal, and the storage content is read out therefrom in a read cycle executed later.

A response signal read out from the memory under test 119 is compared with a reference voltage supplied from the comparison reference voltage source 122 in the comparator 117, and it is determined whether or not the response signal has a predetermined logical level, i.e., whether or not the response signal has a predetermined logical H (logical high) voltage or logical L (logical low) voltage. A response signal determined to have the predetermined logical level is sent to the logical comparator 115, where the response signal is compared with an expected value pattern signal outputted from the pattern generator 112, and whether or not the memory under test 119 has outputted a normal response signal is determined.

If the response signal does not coincide with the expected value pattern signal, the logical comparator 115 determines that the memory cell having an address of the memory under test 119 from which the response signal has been read out is defective (failure), and generates a failure signal indicating that fact. Usually, when the failure signal is generated, a writing of a failure data (generally logical "1" signal) in the failure analysis memory 118 applied to a data input terminal thereof is enabled, and the failure data is stored in an address of the failure analysis memory 118 specified by an address signal being supplied to the failure analysis memory 118 at that time.

The failure analysis memory 118 has its operating rate or speed and its memory capacity equivalent to those of the memory under test 119, and the same address signal as the address signal applied to the memory under test 119 is also applied to this failure analysis memory 118. In addition, the failure analysis memory 118 is initialized prior to the start of a testing. For example, when initialized, the failure analysis memory 118 has data of logical "0s" written in all of the addresses thereof. Every time a failure signal indicating that the anti-coincidence is generated from the logical comparator 115 during a testing of the memory under test 119, a failure data of logical "1" indicating the failure of a memory cell is written in the same address of the failure analysis memory 118 as that of the memory cell of the memory under test 119 from which that anti-coincidence has occurred.

In general, this logical "1" signal is stored in the same address of the failure analysis memory 118 as that of the failure memory cell of the memory under test MUT.

On the contrary, when the response signal coincides with the expected value pattern signal, the logical comparator 115 determines that the memory cell having an address of the memory under test 119 from which the response signal has been read out is not defective (pass), and generates a pass signal indicating that fact. Usually, this pass signal is not stored in the failure analysis memory 118.

After the testing has been completed, the failure data stored in the failure analysis memory 118 are read out therefrom into the failure relief analyzer 120, and it is determined whether a relief or repair of failure memory cells of the tested IC memory 119 is possible or not.

The failure relief analyzer 120 separately and simultaneously counts the total number of failure memory cells stored in the failure analysis memory 118, and the number of failure memory cells on each address line of row (lateral) address lines and column (longitudinal) address lines stored in the failure analysis memory 118, and analyzes to determine whether the relief of the tested memory can be done or not by use of spare lines provided on each of a plurality of storage areas (memory cell array) of the memory under test 119.

Further, in FIG. 5, the block diagram is depicted such that the test pattern signal outputted from the driver 116 is applied to only one input terminal of the memory under test 119, and that a response signal from one output terminal of the memory under test 119 is supplied to the comparator 117. However, the number of drivers 116 provided is actually equal to the number of input terminals of the memory under test 119, for example 512, and the number of comparators 117 provided is also equal to the number of output terminals of the memory under test 119 (since the number of input terminals provided is usually equal to the number of output terminals, the number of comparators 117 provided is equal to the number of drivers 116 provided). In addition, although the input terminals of the memory under test 119 are depicted, in FIG. 5, as separate terminals from the output terminals of the memory under test 119, there are many cases in general that each terminal of the memory under test 119 is used in common as both the input terminal and the output terminal. Moreover, although each of the elements (the main controller 111, the pattern generator 112, the timing generator 113, the waveform formatter 114, the logical comparator 115, the failure analysis memory 118, the failure relief analyzer 120, and the like) except the driver 116 and the comparator 117 is represented by one block, these elements except the main controller 111 and the timing generator 112 are also actually provided as many as the number of the drivers 116 (for example, 512). That is, only the main controller 111 and the timing generator 112 are used in common for the terminals of the memory under test 119.

FIG. 6 shows the internal structure of the memory under test 119. An IC memory constituted by a semiconductor integrated circuit has a plurality of storage areas 2 formed on the same semiconductor chip 1. Each storage area 2 is constituted by many memory cells aligned along row address lines and column address lines, and is called a memory cell array (MCA) in this technical field. A memory element having a desired storage capacity is constituted by these plural storage areas 2. In addition, each of the plurality of storage areas 2 is selectively accessed by a storage area (block) address signal that is to be described later on.

As shown in FIG. 7 in enlarged form, each storage area 2 has a memory cell array MCA in which memory cells have been arrayed in a matrix manner of rows and columns, and in addition to the memory cell array MCA, it is provided with a desired number of row spare lines SR and a desired number of column spare lines SC formed in the row address direction ROW and in the column address direction COL along the periphery of the memory cell array MCA, respectively. These spare lines SR and SC are provided for the purpose of repairing failure memory cells, and serve to change a memory under test that has been determined to be a defective or failure article to a non-defective or pass article by electrically replacing the detected failure memory cells in the storage area 2 with those spare lines. Further, in this example, a case is shown where two row spare lines SR are disposed along one side of the row address direction of the memory cell array MCA and two column spare lines SC are disposed along one side of the column address direction of the memory cell array MCA, respectively. However, it is needless to say that the number of spare lines and the positions where these spare lines are disposed are not limited to the example as illustrated.

Depending upon the number of the spare lines SR formed in the row address direction ROW and the number of spare lines SC formed in the column address direction COL, the number of failure memory cells that can be relieved by the spare lines provided in orthogonal direction to an address line in the storage area 2 is restricted. For this reason, after the testing has been completed, first of all, the number of failure memory cells is searched for each storage area 2, and row address lines and column address lines on which these failure memory cells are present are searched for each storage area 2, thereby to determine whether or not the failure memory cell or cells on the one address line can be relieved by the spare lines orthogonal to this one address line.

The failure relief analyzer 120 includes, as shown in FIG. 8, a row address failure number counter/memory RFC for counting and storing therein the number of failure memory cells present on each of the row address lines in each storage area 2, a column address failure number counter/memory CFC for counting and storing therein the number of failure memory cells present on each of the column address lines in each storage area 2, and a total failure number counter/memory TFC for counting and storing therein the total number of failure memory cells in each storage area 2. Further, the row address failure number counter/memory RFC and the column address failure number counter/ memory CFC are constructed in practice such that these counters/memories RFC and CFC count the number of failure data read out from the failure analysis memory 118 each representing a failure memory cell on each of the row address lines and each of the column address lines, respectively, and the counted values are stored in their respective failure storing memories. The total failure number counter/memory TFC is constructed such that it accumulates, every time a failure data is read out from the failure analysis memory 118, the number of occurrences of failure data, and the accumulated value is stored in the total failure number storing memory of the total failure number counter/memory TFC.

As an occurrence state of failure memory cells, there is a case that, as shown in FIG. 9, many failure cells FC are present on one row address line RLN or on one column address line CLN and that the number of failure memory cells FC on one address line is larger than the number of spare lines SC or SR provided in the direction orthogonal to the address line RLN or CLN. Such state is generally called a must-repair MS in this technical field. This must-repair MS cannot be repaired by the spare lines SC or SR provided in the direction orthogonal to its address line RLN or CLN. Accordingly, it is necessary to relieve such a must-repair using a spare line SR or SC that is provided in parallel to the must-repair address line RLN or CNL. As a failure relief analyzing procedure, the must-repair MS must be first detected, and then, the spare line used for the repair of the must-repair MS and the repaired failure memory cells are excluded from the consideration for further failure relief, and thereafter it is determined whether or not the remaining failure memory cells can be relieved by the remaining spare lines.

A must-repair MS is searched in both the row address direction ROW and the column address direction COL. Specifically explaining, by reading out, first, the storage content of the row address failure number counter/memory RFC in sequence of the row addresses, the number of failure memory cells present on each of the row address lines of each storage area 2 can be read out. The number X1 of failure memory cells stored in each of the row addresses is compared with the number Y1 of the column spare lines SC. If the comparison result is X1>Y1, that row address having the number X1 of failure memory cells is determined to be in must-repair state. The row address determined to be in must-repair state is sent to the main controller 111, and is stored therein as a row must-repair address.

Next, by reading out the storage content of the column address failure number counter/memory CFC in sequence of the column addresses, the number of failure memory cells present on each of the column address lines of each storage area 2 can be read out. The number X2 of failure memory cells stored in each of the column addresses is compared with the number Y2 of the row spare lines SR. If the comparison result is X2>Y2, that column address having the number X2 of failure memory cells is determined to be in must-repair state. The column address determined to be in must-repair state is sent to the main controller 111, and is stored therein as a column must-repair address.

When the search operation of must-repair addresses has been completed, the main controller 111 sets the stored row and column must-repair addresses in the failure relief analyzer 120, and makes the failure relief analyzer 120 perform a data updating operation. A must-repair MS cannot be repaired unless one spare line that is in parallel with the must-repair address line is used. Therefore, if a must-repair MS is present only on one row address line RLN, for example, one row spare line SR must be used. As a result, if a must-repair MS is present only on one row address line RLN, there is performed an operation of decreasing the number of row spare lines SR by one as well as subtracting the number of failure memory cells on the row address line on which the must-repair MS is present from each of the row address failure number counter/memory RFC, column address failure number counter/memory CFC and the total failure number counter/memory TFC. By this operation, the row address line on which the must-repair has been present would have been repaired to a non-defective row address line.

Even if only one must-repair address is present on one of the row addresses, the number of the row spare lines SR is decreased by one, and hence the number of the row spare lines SR is changed. As a result, regarding the column address lines that are orthogonal to the row spare lines SR, a search operation for a must-repair must be performed again on the basis of the changed number of the row spare lines SR. The search condition in this case is to compare the number X2 of failure memory cells of each column address with a numerical value Y2−1 resulting from the subtraction of one (1) from the number Y2 of the row spare lines SR. If the comparison result X2>Y2−1 is detected, that column address is sent to the main controller 111 as a column must-repair address, and is stored therein.

When the search operation of must-repair addresses in the column address direction COL has been completed, the main controller 111 sets again in the failure relief analyzer 120 the column must-repair address or addresses detected with respect to the column addresses, and makes the failure relief analyzer 120 perform a data updating operation. If a must-repair MS is present only on the column address line CLN, for example, this data updating operation is such that assuming that one column spare line SC has been used, the number of the column spare lines SC is subtracted by one (1), and further, the number of failure memory cells on the column address line on which the must-repair MS has been present is subtracted from each of the row address failure number counter/memory RFC, the column address failure number counter/memory CFC, and the total failure number counter/memory TFC. By this operation, the column address line on which the must-repair has been present would have been repaired to a non-defective column address line.

Since the number of the column spare lines SC is decreased by one by such updating operation, a search operation for a must-repair must be performed again this time with respect to the row address lines that are orthogonal to the column spare lines SC. In such manner, the search operation for a must-repair and the updating operation of the analysis data are repeated until any must-repair is not detected.

FIG. 10 shows an example in which a must-repair MS is present, for example, on an address line RLN having a row address RN in a storage area 2, the number of failure memory cells that compose the must-repair MS is, as illustrated, "9", a failure memory cell FC is present in addition to this must-repair MS on each of other three row address lines as illustrated, two of these three failure memory cells FC are present on a column address line on which one of the failure memory cells of the must-repair MS is present, and remaining one failure memory cell FC is present on another column address line on which another one of the failure memory cells FC of the must-repair MS is present. In this case, a numerical value "9" is stored, as illustrated, in a row address RN of the row address failure number counter/memory RFC as the number of failure memory cells. A numerical value "1" is stored, as illustrated, in each of these other three row addresses of the row address failure number counter/memory RFC as the number of failure memory cells. On the other hand, as illustrated, numeric values "3", "1", "1", "1", "2", "1", "1", "1", "1" are stored in nine column addresses of the column address failure number counter/memory CFC, respectively.

As mentioned above, in order to relieve the must-repair MS on the row address line RLN, one of the row spare lines SR must be used. Therefore, if it is assumed that the must-repair MS in the row address RN is relieved using one of the spare lines SR, the numerical value stored in the row address RN of the row address failure number counter/memory RFC is decreased from "9" to "0" since the number of failure memory cells on the row address line is "9". However, the numerical value "1" stored in each of the three other row addresses remains unchanged. Since each of the nine numerical values stored in each of all the nine column addresses of the column address failure number counter/memory CFC is decreased by one, those stored values become "2", "0", "0", "0", "1", "0", "0", "0", "0", respectively. In addition, the numerical value stored in the total failure number counter/memory TFC is decreased from "12" to "3".

The present invention relates to a method of analyzing a relief of failure cells in a memory that can locate in a short time addresses of remaining failure memory cells FC after the aforementioned relief processing of the must-repair MS is performed and a memory testing apparatus having a failure relief analyzer using this method.

In order to change a memory under test 119 to a non-defect article, all the failure memory cells whose failure data are stored in the failure analysis memory 118 must be relieved. Therefore, in a example shown in FIG. 10, it is necessary to relieve, using the spare lines SR and SC, all the failure memory cells FC remaining after the relief processing of the must-repair MS is performed. For this purpose, addresses of the failure memory cells FC remaining after the relief processing of the must-repair MS is performed must be located.

In the prior art system, the contents of the row address failure number counter/memory RFC are read out, under control of the main controller 111, in the sequential order in the row address direction ROW, and whenever the number of remaining failure memory cells is detected, the corresponding row address is stored in the main controller 111. In this manner, whether or not a failure memory cell is present is checked through the last row address. Similarly, the contents of the column address failure number counter/memory CFC are read out in the sequential order in the column address direction COL, and whenever the number of remaining failure memory cells is detected, the corresponding column address is stored in the main controller 111. In this manner, whether or not a failure memory cell is present is checked through the last column address.

When the searching operation of failure memory cells in the row address direction and the searching operation of failure memory cells in the column address direction are completed, the row addresses and the column addresses in which failure memory cells are present that have been temporarily stored in the main controller 111 are read out therefrom. A failure data of a failure memory cell FC is stored in the failure analysis memory 118, and each of a row address and a column address read out from the main controller 111 merely specifies only an address of an address line of the failure analysis memory 118 in which the failure memory cell FC is present. That is, each of a row address and a column address does not specify an address of the failure analysis memory 118 in which the failure memory cell FC is present. Therefore, since it is not possible to determine on which crossing point between a row address line and a column address line respectively corresponding to the read out row address and column address the failure memory cell FC is present, it is necessary to create addresses corresponding to all the crossing points to read out the contents of the failure analysis memory 118.

FIG. 11 shows, by a symbol "x", crossing points produced by row address lines and column address lines respectively corresponding to the row addresses and column addresses at each of which a failure memory cell is present, the row and column addresses being read out from the main controller 111. Since crossing points on each of which a failure memory cell FC is present cannot be specified by only the read out addresses, in the prior art, the addresses corresponding to all of the illustrated crossing points are created, and the contents of the failure analysis memory 118 are read out with respect to these addresses to specify the addresses of the failure memory cells FC that actually exist, and thereafter the specified addresses are stored in the main controller 111. In reality, a failure memory cell FC is present on each of only the three crossing points each being shown by a symbol $\otimes$. Therefore, in the example shown in FIG. 11, unproductive or useless reading operations have been performed for a half (½) of six crossing points.

In this manner, in order to execute a relief analysis of failure memory cells still remaining after the process of relieving the must-repair MS has been performed, in the prior art, row addresses and column addresses at each of which at least one failure memory cell is present are previously detected under the control of the main controller 111 to store these addresses in the main controller 111. Then, these stored row addresses and column addresses are read out therefrom, and thereafter, the storage contents of the failure analysis memory 118 are read out from all of the addresses each having a possibility that a failure data of a failure memory cell may be present, and addresses at each of which a failure memory cell is really present are specified, thereby to store the specified addresses in the main controller 111. For this reason, the searching operation for address lines where failure memory cells remain, i.e., reading of the row address failure number counter/memory RFC and the column address failure number counter/memory CFC, formatting of the addresses where failure memory cells may be present, and reading of the failure analysis memory 118 must be repeatedly done many times. Accordingly, there is a drawback in the prior art that the efficiency is very low, and it takes a long time to search addresses of failure memory cells.

In recent years, there has been a tendency that the storage capacity of a memory under test is increasing, and the number of storage areas to be relieved and the area of each of the storage areas are increased. Therefore, the searching time of the addresses of failure memory cells still remaining after completion of the relief operation of a must-repair has been increased more and more, which results in a great obstacle to a quick or high-speed processing of a failure relief analysis for a memory. In addition, in this manner, a long time is needed to perform a processing of the relief analysis of failure memory cells, resulting in a problem that the testing time of an IC memory is made long as a whole.

SUMMARY OF THE INVENTION

It is a first object of the present invention to provide a method of analyzing a relief of failure cells in a memory, which is capable of completing a failure relief analysis in a short time even if a memory under test has many storage areas.

It is a second object of the present invention to provide a memory testing apparatus having a failure relief analyzer using the above method of analyzing a relief of failure cells.

It is a third object of the present invention to provide a method of analyzing a relief of failure cells in a memory, which is capable of searching and detecting in a short time an address of a failure memory cell remaining in a memory after a process for relieving a must-repair has been completed.

It is a fourth object of the present invention to provide a memory testing apparatus having a failure relief analyzer using the method of analyzing a relief of failure cells described in the above third object of the present invention.

In order to accomplish the aforesaid objects, there is provided, in one aspect of the present invention, a method of analyzing a repair of failure cell in a memory comprising the steps of: testing a memory having a plurality of storage areas selectively accessed to carry out a reading operation and a writing operation; and detecting the number of failure memory cells and addresses thereof resulting from the test result to analyze whether the memory under test can be relieved or not, and further comprising the steps of: searching each of the plural storage areas to determine whether any failure memory cell is present in each storage area or not; searching, each time a failure memory cell is detected, a row address or column address of the detected failure memory cell on the storage area from which the failure memory cell has been detected; detecting, each time a row address or column address of the detected failure memory cell is detected, a column address or row address of the detected failure memory cell on the detected row address line or column address line, thereby to specify an address of the detected failure memory cell; and storing the specified address of the detected failure memory cell.

In another aspect of the present invention, there is provided a memory testing apparatus provided with a failure relief analyzer and for testing a memory having a plurality of storage areas, the failure relief analyzer comprising: an analyzed storage area detector for searching whether a failure memory cell exists or not on each of plural storage areas of a memory under test and determining whether a failure relief analysis should be performed or not for each storage area; a failure line searching apparatus for detecting, in the storage area where said analyzed storage area detector has determined that a failure relief analysis should be performed, row addresses or column addresses to detect whether a failure memory cell exists or not; an address scanning apparatus started when the failure line searching apparatus detects a row address line or column address line where a failure memory cell exists, and detecting an address in the direction orthogonal to the row address line or column address line on which the detected failure memory cell exists; and a failure cell address memory for storing the address of the failure memory cell detected by the failure line searching apparatus and the address scanning apparatus.

In a preferred embodiment, the aforesaid analyzed storage area detector of the failure relief analyzer comprises: a storage area address generator for generating addresses given respectively to said plurality of storage areas constituting the memory under test; a total failure number counter/memory accessed by storage area address signals outputted from the storage area address generator and for storing the total number of failure memory cells for each storage area; zero detector for detecting the fact that the total number of failure memory cells read out of said total failure number counter/memory is "0" or a numerical value other than "0".

The aforesaid failure line searching apparatus of the failure relief analyzer comprises: a row address generator or column address generator for generating row addresses or column addresses on each of the storage areas; a row address failure number counter/memory or column address failure number counter/memory for storing the number of failure memory cells on each row address line or each column address line for each storage area; zero detector for detecting whether the number of failure memory cells read out of either one of the row address failure number counter/memory or column address failure number counter/memory is "0" or a numerical value other than "0"; and means of starting the operation of the address scanning apparatus each time the zero detector detects a numerical value other than "0".

The aforesaid address scanning apparatus of the failure relief analyzer comprises: a column address generator or row address generator for generating column addresses or row addresses on each of the storage areas; a column address failure number counter/memory or row address failure number counter/memory for storing the number of failure memory cells on each column address line or each row address line for each storage area; zero detector for detecting whether the number of failure memory cells read out of either one of the column address failure number counter/memory or row address failure number counter/memory is "0" or a numerical value other than "0"; and writing control means for causing addresses to be stored in the failure cell address memory, the addresses being specified by address signals generated respectively from the storage area address generator, the row address generator and the column address generator, each time the zero detector detects a numerical value other than "0" and at the same time a read-out data of a failure analysis memory provided in the memory testing apparatus is "fail".

According to the method of analyzing a relief of failure cells in a memory and the memory testing apparatus having a failure relief analyzer using this method, a row address or a column address at which a failure memory cell is present is detected by a failure line searching apparatus. When a row address or a column address at which a failure memory cell is present is detected, addresses (column addresses or row addresses) in the orthogonal direction to the row address line or column address line are immediately searched at that address position by an address scanning apparatus, and at the same time, the content of the failure analysis memory is read out, thereby to specify an address of the detected failure memory cell.

When an address of the failure memory cell is specified with respect to its row address and its column address, that address is stored in a memory, and the failure line searching apparatus is re-started to operate, thereby to continue the searching operation for a failure cell. When the failure cell searching operation reaches the last row address or column address, the failure relief analysis of that storage area is completed, and the object to be analyzed is moved to the failure relief analysis of the next storage area.

In this manner, when the failure line searching apparatus detects the presence of a failure memory cell, a search for addresses in the orthogonal direction is immediately executed at that address position so that an address of the detected failure memory cell is specified. As a result, there is no need to perform such operation that the address where a failure memory cell is detected is once set, and that the stored addresses are read out after all of the searching operation for failure memory cells have been completed to specify an address of each of the failure memory cells as in the prior art. Accordingly, an address of a failure memory cell can be specified in a short time, resulting in that the time period required for a failure relief analysis can be considerably decreased.

DETAILED DESCRIPTION OF THE PREFERRED EMBODIMENTS

Figure 1:
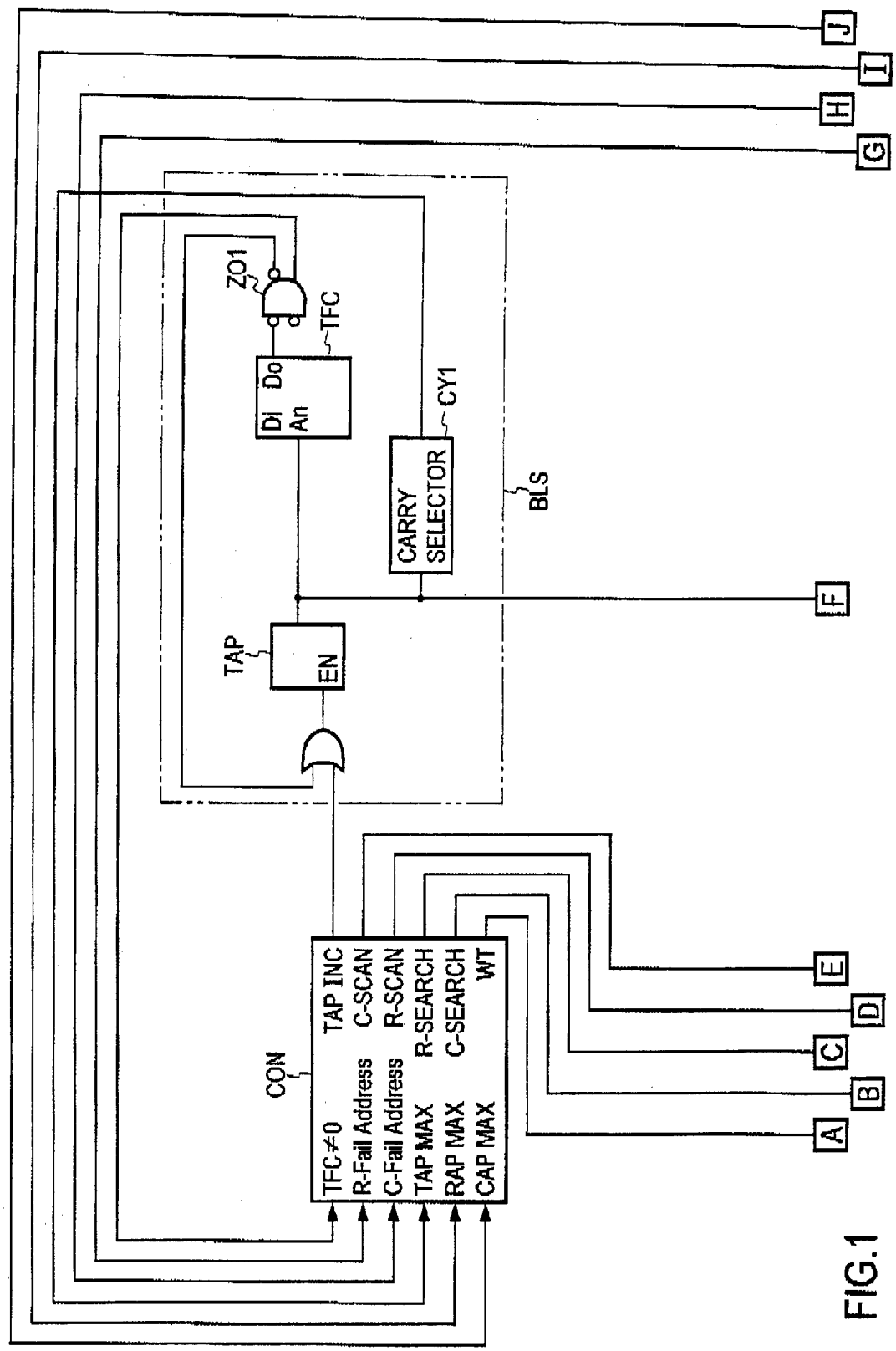
FIG. 1 is a block diagram showing configurations of, mainly, an analyzed storage area detector and a controller in an embodiment of the failure relief analyzer used in a memory testing apparatus according to the present invention.
Figure 2:
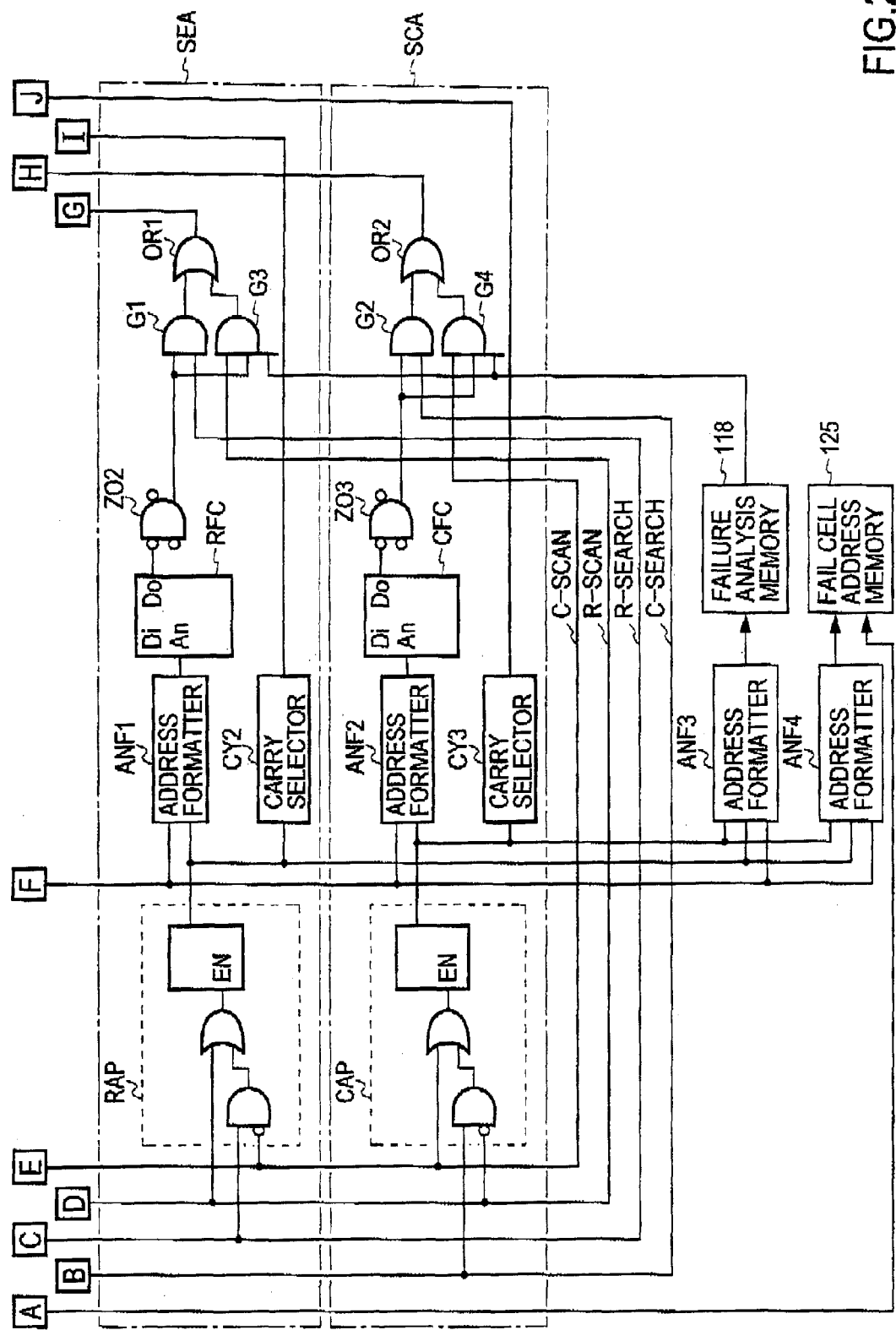
FIG. 2 is a block diagram showing configurations of, mainly, a failure line searching apparatus and an address scanning apparatus in the embodiment of the failure relief analyzer used in the memory testing apparatus according to the present invention.

First, an embodiment of the failure relief analyzer used in a memory testing apparatus according to the present invention will be described in detail with reference to FIGS. 1 and 2. FIGS. 1 and 2 show, as a whole, the configuration of the failure relief analyzer by interconnecting terminals "A" to "J" shown in FIG. 1 with terminals "A" to "J" shown in FIG. 2, respectively.

FIG. 1 shows configurations of mainly, an analyzed storage area detector BLS, and a controller CON, respectively, and FIG. 2 shows configurations of, mainly, a failure line searching apparatus SEA, and an address scanning apparatus SCA, respectively. The controller CON shown in FIG. 1 controls these components BLS, SEA, and SCA.

Figure 5:
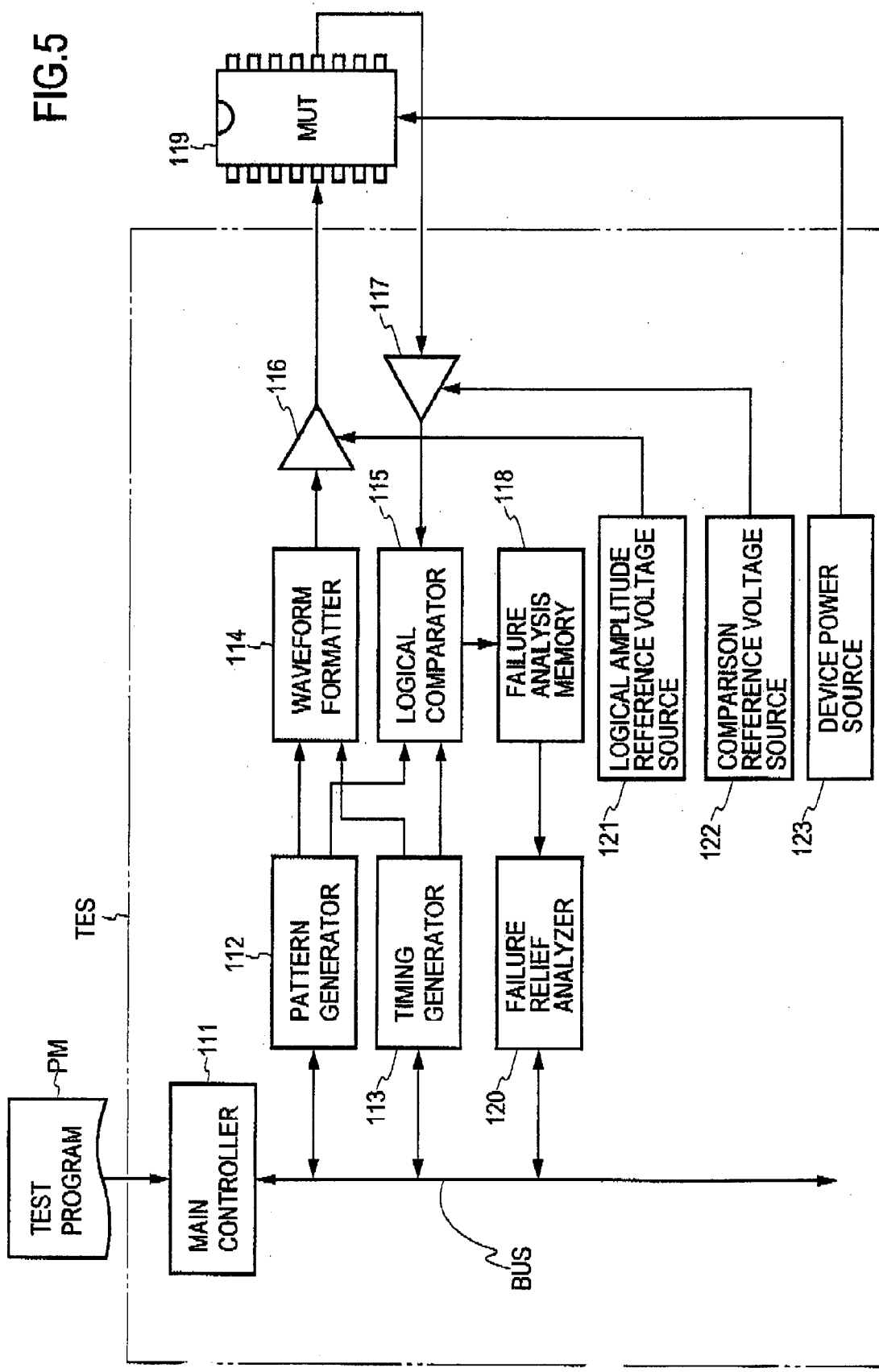
FIG. 5 is a block diagram showing a general configuration of a conventional memory testing apparatus.
Figure 6:
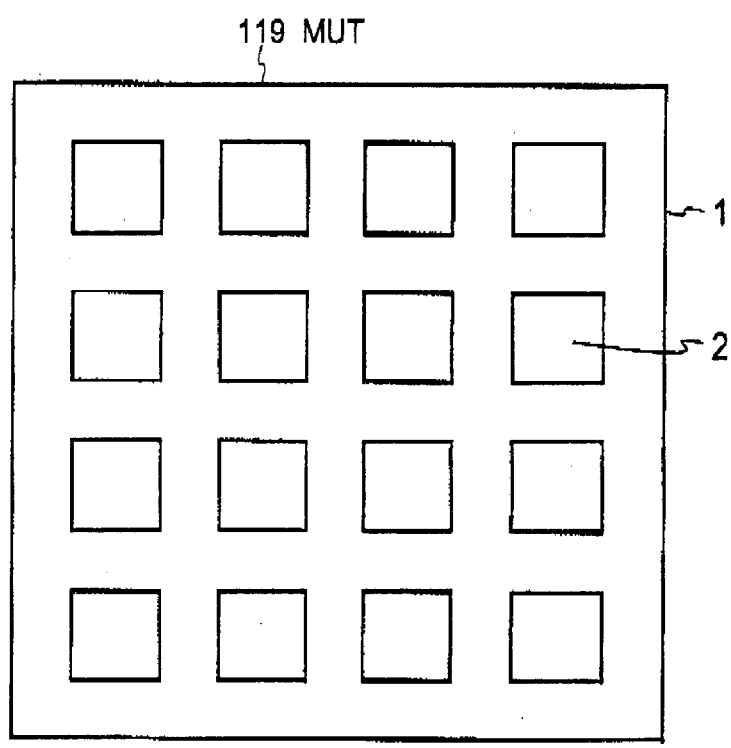
FIG. 6 is an enlarged plan view for explaining an example of the internal structure of a redundancy-structured memory under test.
Figure 7:
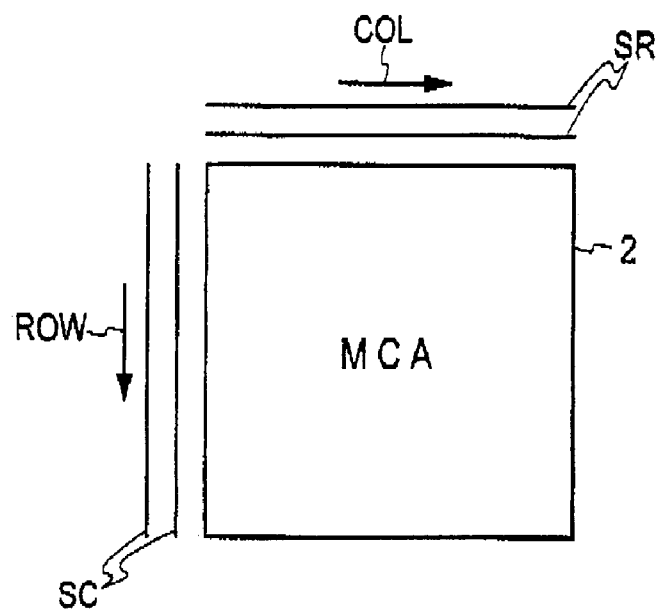
FIG. 7 is an enlarged plan view showing one of the storage areas of the redundancy-structured memory under test shown in FIG. 6.
Figure 8:
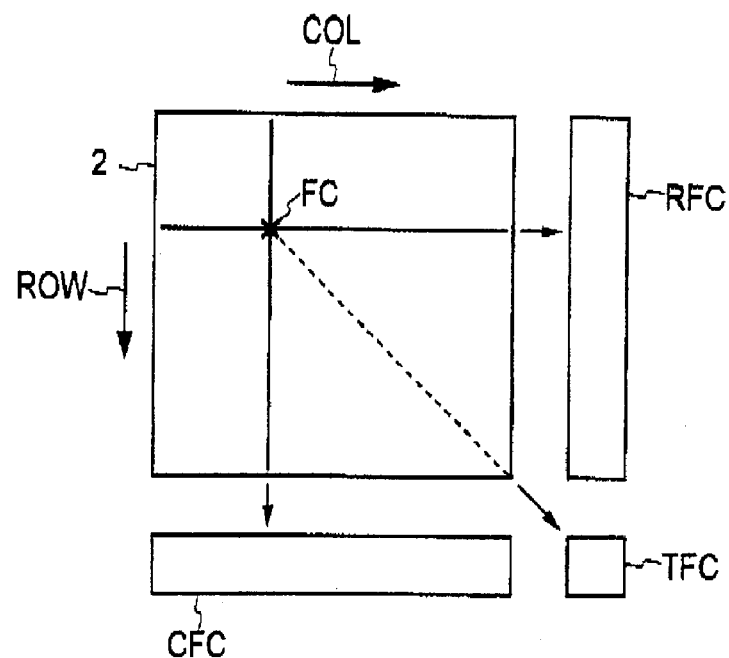
FIG. 8 is a diagram for explaining the counting operation of failure memory cells performed in the failure relief analyzer shown in FIG. 5.

The analyzed storage area detector BLS is an apparatus for detecting a storage area 2 to be analyzed in the memory under test 119 (see FIGS. 5 and 6), and comprises the total failure number counter/memory TFC shown in FIG. 8, a storage area address generator TAP, and a first zero detector ZO1. As described before with reference to FIGS. 6 and 7, the total number of failure memory cells having occurred in each of the storage areas 2 of the memory under test 119 read out of the failure analysis memory 118 is stored in the total failure number counter/memory TFC at an address thereof corresponding to each storage area. The storage area address generator TAP increments its address by one in regular sequence starting from the first address and in the address increasing manner to generate address signals specifying respective storage area 2.

Figure 9:
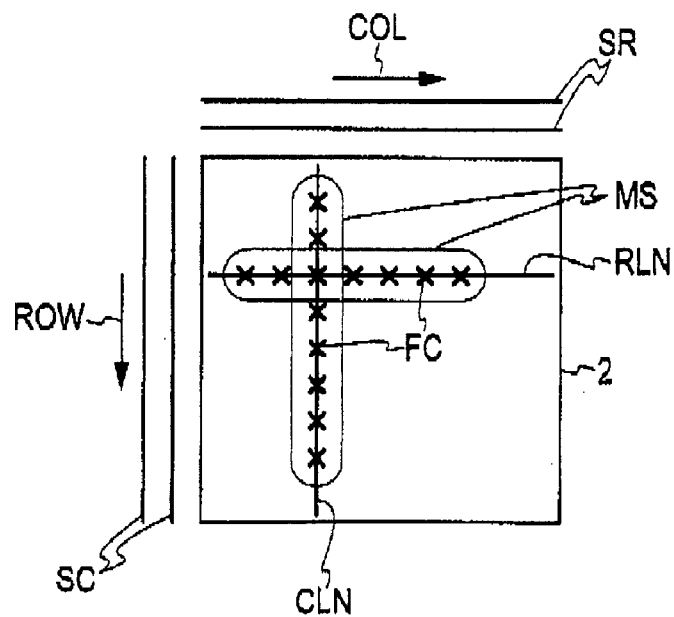
FIG. 9 is an enlarged plan view for explaining a must-repair relieving method performed in the failure relief analyzer shown in FIG. 5.

The failure line searching apparatus SEA is an apparatus for searching failure memory cells present, in this embodiment, on row address lines in each storage area among failure memory cells (called bit failures in this technical field) in a memory under test 119 still remaining therein after a must-repair MS (refer to FIG. 9) has been repaired. Accordingly, the failure line searching apparatus SEA includes a logic circuit comprising a row address generator RAP, an RFC address formatter ANF1, the row address failure number counter/memory RFC shown in FIG. 8, a second zero detector ZO2, a row address carry selector CY2, a first and a third AND gate G1 and G3, and a first OR gate OR1. As mentioned above, the numbers of failure memory cells on row address lines in each storage area 2 of a memory under test 119 read out from the failure analysis memory 118 are stored in the row address failure number counter/memory RFC.

The address scanning apparatus SCA is an apparatus for scanning column addresses, in this embodiment, on the row address line detected by the failure line searching apparatus SEA on which a failure memory cell is present in each storage area. Accordingly, the address scanning apparatus SCA includes a logic circuit comprising a column address generator CAP, an CFC address formatter ANF2, the column address failure number counter/memory CFC shown in FIG. 8, a third zero detector ZO3, column address carry selector CY3, a second and a fourth AND gates G2 and G4, and a second OR gate OR2. As mentioned above, the numbers of failure memory cells on row address lines in each storage area 2 of a memory under test 119 read out from the failure analysis memory 118 are stored in the row address failure number counter/memory RFC.

The row address generator RAP increments by one its row address from the starting address to the last address, and generates row address signals corresponding to respective row addresses to supply these row address signals to the RFC address formatter ANF1. In addition, the column address generator CAP increments by one its column address from the starting address to the last address, and generates column address signals corresponding to respective column addresses to supply these column address signals to the CFC address formatter ANF2.

The RFC address formatter ANF1 formats (combines) a row address signal outputted from the row address generator RAP and a storage area address signal outputted from the storage area address generator TAP to output an RFC address signal, and accesses the row address failure number counter/memory RFC using the RFC address signal. An RFC address signal is an address signal for specifying one of the rows in one of the storage areas, and comprises a storage area address signal and a row address signal of the specified storage area.

The CFC address formatter ANF2 formats a column address signal outputted from the column address generator CAP and a storage area address signal outputted from the storage area address generator TAP to output a CFC address signal, and accesses the column address failure number counter/memory CFC using the CFC address signal. A CFC address signal is an address signal for specifying one of the columns in one of the storage areas, and comprises a storage area address signal and a column address signal of the specified storage area.

An address signal generated by the storage area address generator TAP is inputted to an address input terminal An of the total failure number counter/memory TFC, and the total number of failure memory cells in the corresponding storage area is read out from the address of the total failure number counter/memory TFC specified by the address signal. The total number of failure memory cells read out from the total failure number counter/memory TFC is inputted to the first zero detector ZO1. This first zero detector ZO1 determines whether the number of failure memory cells is "0" or a number other than "0".

If the total number of failure memory cells read out from the total failure number counter/memory TFC is "0", it is not necessary to perform the relief analysis for the storage area 2 corresponding to the inputted address signal. Therefore, an enable signal (logical H signal) indicating this is supplied from an inverting output terminal of the first zero detector ZO1 to an enable terminal EN of the storage area address generator TAP. Then the storage area address generator TAP increments the address by one to generate the next address signal, and supplies the generated address signal to the address input terminal An of the total failure number counter/memory TFC. This operation is repeated during the time when "0s" are continuously read out from the total failure number counter/memory TFC.

If the total number of failure memory cells read out from the total failure number counter/memory TFC is a number other than "0", there is a possibility that a failure memory cell is present in the storage area. Therefore, it is necessary to temporarily stop the address incrementing operation (the operation for incrementing the address of storage area by one in the sequential order from the starting address to the last address to generate an address signal) of the storage area address generator TAP. For this reason, if the total number of failure memory cells is a number other than "0", a detection signal TFC≠0 indicating this is sent from a non-inverting terminal of the first zero detector ZO1 to the controller CON. Upon receiving this detection signal TFC≠0, the controller CON generates a control signal R-SEARCH or C-SEARCH as will be explained later on. On the other hand, since an enable signal is not supplied from the first zero detector ZO1 to an enable terminal EN of the storage area address generator TAP, the storage address generator TAP does not perform the address incrementing operation. As a result, the storage area address generator TAP is held in the state that an address signal corresponding to a storage area (a storage area for which a detection signal TFC≠0 is outputted from the first zero detector ZO1) other than a storage area having the total number of failure memory cells "0" is being outputted.

A storage area address signal outputted from the storage area address generator TAP is also supplied to the respective address input terminals An of the row address failure number counter/memory RFC and the column address failure number counter/memory CFC via the RFC address formatter ANF1 and the CFC address formatter ANF2, respectively.

A storage address carry selector (carry detector) CY1 is connected to the storage area address generator TAP. A storage area address signal is also supplied to the storage area address carry selector CY1. When the storage area address carry selector CY1 detects that the storage area address generator TAP has generated address signals corresponding to the total number of storage areas of the memory under test to be relieved minus 1, i.e., the storage area address generator TAP has generated a storage area address signal immediately before the last storage area address signal (for example, a signal of all the predetermined number of bits constituting an address signal are "1s" ), a carry signal TAP MAX is sent to the controller CON from the storage area address carry selector CY1. Alternatively, the storage area address carry selector CY1 may be constructed such that when the storage area address carry selector CY1 detects that the storage area address generator TAP has generated the last storage area address signal, a carry signal TAP MAX is sent to the controller CON from the storage area address carry selector CY1.

A row address carry selector CY2 and a column address carry selector CY3 are also connected to the row address generator RAP and the column address generator CAP, respectively. A row address signal is supplied to the row address carry selector CY2 from the row address generator RAP, and a column address signal is supplied to the column address carry selector CY3 from the column address generator CAP. When these carry selectors CY2 and CY3 detect that the corresponding address generators RAP and CAP have generated all the row address signals and all the column address signals, respectively, i.e., the last row address signal and the last column address signal, respectively (for example, a signal of all the predetermined number of bits constituting an address signal being "1s" ), carry signals RAP MAX and CAP MAX are sent to the controller CON from the carry selectors CY2 and CY3, respectively. Alternatively, the row address carry selector CY2 and the column address carry selector CY3 may be constructed such that when the row and column address generators RAP and CAP have generated the last row address signal and the last column address signal, respectively, these carry selectors CY2 and CY3 detect that the state that "1s" are added to these address signals, respectively, and carry signals RAP MAX and CAP MAX are sent to the controller CON from these carry selectors CY2 and CY3, respectively.

Furthermore, in this embodiment, there is shown a case in which the failure relief analyzer is constructed such that address signals outputted respectively from the storage area address generator TAP, the row address generator RAP and the column address generator CAP are also supplied to an AFM address formatter ANF3 and FCA (failure cell address memory) address formatter ANF4, and when a failure relief analysis is performed, the failure analysis memory 118 is accessed by an AFM address signal that is obtained by formatting these address signals in the AMF address formatter ANF3 to read out failure data stored in the failure analysis memory 118 simultaneously with reading operations of the aforementioned row address failure number counter/memory RFC and column address failure number counter/memory CFC, and then a searching operation of failure memory cell addresses is performed by correlating the failure memory cell addresses stored in the failure analysis memory 118 with the failure memory cell addresses stored in the row address failure number counter/memory RFC or the column address failure number counter/memory CFC. In addition, the failure relief analyzer is constructed such that the failure cell address memory 125 is accessed by an FCA address signal that is obtained by formatting these address signals in the FCA address formatter ANF4 to store the row and column addresses detected and stored in the controller CON together with the corresponding storage area. Of course, the present invention is not limited to this configuration.

Next, the failure relief analyzing operation (in this embodiment, a searching operation of an address line of a failure memory cell, a detecting operation of a failure memory address and a writing operation) performed by the failure relief analyzer constructed as mentioned above will be described.

When the number of failure memory cells read out from the total failure number counter/memory TFC is not "0", the first zero detector ZO1 outputs a detection signal TFC≠0 and the detection signal is sent to the controller CON. Upon receiving the detection signal TFC≠0, the controller CON outputs a control signal R-SEARCH or C-SEARCH. The storage area address generator TAP stops, as mentioned above, the address incrementing operation when the detection signal TFC≠0 is outputted from the first zero detector ZO1.

The control signal R-SEARCH is supplied to the row address generator RAP of the failure line searching apparatus SEA and a first AND gate G1 to start the failure memory cell searching operation with respect to row addresses. On the contrary, the control signal C-SEARCH is supplied to the column address generator CAP of the address scanning apparatus SCA and a second AND gate G2 to start the failure memory cell searching operation with respect to column addresses. The sequence as to which addresses of the row addresses or the column addresses should be searched first can be set in the controller CON in advance.

Here, a case in which the controller CON outputs a control signal R-SEARCH for searching in the row address direction first will be described.

When the control signal R-SEARCH is outputted (the R-SEARCH is outputted, for example, by changing from logical L to logical H), the row address generator RAP starts its operation, and reads out, from the row address failure number counter/memory RFC, the respective numbers of failure memory cells on all the row address lines starting from the first row address to the last row address in the storage area specified by an address signal from the storage area address generator TAP. In addition, the first AND gate G1 is in the enable state since the control signal R-SEARCH is applied thereto.

The stored data (the number of failure memory cells) read out from the row address failure number counter/memory RFC is inputted to the second zero detector ZO2. This second zero detector ZO2 determines whether the number of failure memory cells on each row address line is "0" or a number other than "0". If the number of failure memory cells is "0", it is not necessary to perform a column address detection since no failure memory cell is present on address lines corresponding to the inputted row address signal. Therefore, although not shown, an enable signal (logical H signal) indicating this is supplied from an inverting output terminal of the second zero detector ZO2 to the enable terminal EN of the row address generator RAP. As a result, the row address generator RAP increments by one the address, and outputs a next row address signal. During a time when "0s" are continuously read out from the row address failure number counter/memory RFC, this operation is repeated.

If the number of failure memory cells is not "0", a logical H signal is outputted from a non-inverting output terminal of the second zero detector ZO2, and is inputted to the other input terminal of the first AND gate G1. Since the first AND gate G1 is in the enable state, the AND gate G1 outputs a logical H signal when the logical H signal from the second zero detector ZO2 is applied to the AND gate G1. The logical H signal from the AND gate G1 is sent to the controller CON via a first OR gate OR1 as a control signal R-Fail Address representing an address of a failure memory cell present in the row address. Upon receiving the control signal R-Fail Address, the controller CON temporarily stops the generation of the control signal R-SEARCH (for example, changes from logical H to logical L) to stop the address incrementing operation of the row address generator RAP. At the same time, the controller CON outputs a control signal C-SCAN (for example, changes from logical L to logical H). This control signal C-SCAN is inputted to an AND gate of the row address generator RAP, an OR gate of the column address generator CAP and one input terminal of the fourth AND gate G4.

Here, regarding the row address generator RAP, when a logical H signal is outputted from the non-inverting output terminal of the second zero detector ZO2 to the first AND gate G1, a logical L signal is outputted from the inverting output terminal thereof. Consequently, since an enable signal is not supplied to the enable terminal EN of the row address generator RAP, the row address generator does not perform the address incrementing operation. As a result, the row address generator RAP is held in the state that the row address generator RAP is outputting a row address signal corresponding to a row address line on which a failure memory cell is detected.

Further, in this embodiment, since the control signal C-SCAN outputted from the controller CON is supplied to the inverting input terminal of the AND gate of the row address generator RAP so that the AND gate is in the disable state, the row address generator RAP is constructed such that even if, for example, the controller CON does not stop the control signal R-SEARCH being supplied to a non-inverting terminal of the AND gate, the address incrementing operation of the row address generator RAP is stopped by outputting the control signal C-SCAN. Of course, the present invention is not limited to such a configuration.

As a result, when the control signal C-SCAN is outputted, the column address generator CAP starts its operation, and reads out, from the column address failure number counter/memory CFC, the respective numbers of failure memory cells on all the column address lines starting from the first column address to the last column address in the storage area in which the row address searching operation is being performed. At the same time, a column address signal is supplied in addition to a storage area address signal and a row address signal to the AFM address formatter ANF3. Therefore, the stored data (the number of failure memory cells) of column addresses with respect to a specific row address line in a corresponding storage area of the failure analysis memory 118 are read out from the addresses starting from the first address to the last address in the sequential order, and are inputted to the respective other input terminals of the third and fourth AND gates.

The number of failure memory cells read out from the column address failure number counter/memory CFC is inputted to the third zero detector ZO3. This third zero detector ZO3 determines whether the number of failure memory cells on each column address line is "0" or a number other than "0". If the number of failure memory cells is "0", no failure memory cell is present on the address line corresponding to the inputted column address signal. Therefore, although not shown, an enable signal (logical H signal) indicating this is supplied from the inverting output terminal of the third zero detector ZO3 to the enable terminal EN of the column address generator CAP. As a result, the column address generator CAP increments the address by one the, and outputs the next column address signal. At the same time, the third zero detector ZO3 supplies from its non-inverting terminal a logical L signal to one input terminal of the second AND gate G2 and to the remaining input terminal of the fourth AND gate G4. Therefore, these AND gates G2 and G4 are still in the disable state. During a time when "0s" are read out from the column address failure number counter/memory CFC, this operation is repeated.

If the number of failure memory cells read out from the column address failure number counter/memory CFC is not "0", a logical H signal is outputted from the non-inverting terminal of the third zero detector ZO3, and is supplied to the second and fourth AND gates G2 and G4. Since the second AND gate G2 is still in the disable state, a logical H signal is not outputted from the AND gate G2. On the other hand, since the fourth AND gate G4 is in the enable state when a logical H signal is being supplied thereto from the non-inverting terminal of the third zero detector ZO3, if a data read out from the failure analysis memory 118 is a logical H ("1") signal representing existence of a failure memory cell, the fourth AND gate G4 outputs a logical H signal. This logical H signal is sent to the controller CON via the second OR gate OR2 as a control signal C-Fail Address representing a column address of the detected failure memory cell.

Further, during a time when a logical H signal is outputted from the third zero detector ZO3 to the second and fourth AND gates G2 and G4, a logical L signal is outputted from the inverting output terminal of the third zero detector ZO3. In this case, since an enable signal is not supplied to an enable terminal EN of the column address generator CAP, the column address generator CAP does not perform its address incrementing operation. As a result, the column address generator CAP is held in the state that the column address generator CAP is outputting a column address signal corresponding to a column address line on which a failure memory cell is detected.

Upon receiving the control signal C-Fail Address, the controller CON outputs a write signal WT to write a storage area address, a row address and a column address that represent a position of a detected failure memory cell in the failure cell address memory 125. Specifically explaining, a storage area address signal, a row address signal and a column address signal being generated are formatted in the FCA address formatter ANF4 to generate an FCA address signal, and the failure cell address memory 125 is accessed using this FCA address signal to write the storage area address, the row address and the column address of the failure memory cell that were detected and stored in the controller CON in the failure cell address memory 125. If necessary, the controller CON may temporarily stop outputting the control signal C-SCAN (changing from logical H to logical L) when it has received the control signal C-Fail Address.

After the writing operation has been completed, the column address generator performs repeatedly the operation of incrementing the column address by one. In case that the control signal C-SCAN has been temporarily stopped, the controller CON outputs a control signal C-SCAN again. When the column address reaches the last column address by the column address incrementing operation of the column address generator CAP, a carry signal CAP MAX is sent from the column address carry selector CY3 to the controller CON. Therefore the controller CON stops outputting the control signal C-SCAN (switching from logical H to logical L), and instead, outputs a control signal R-SEARCH again (switch to logical H) to increment the address value of the row address generator RAP by one, thereby to resume the above-mentioned searching operation for failure memory cells for searching whether or not a failure memory cell is present on the next row address and the subsequent row addresses.

Figures 3, 4:
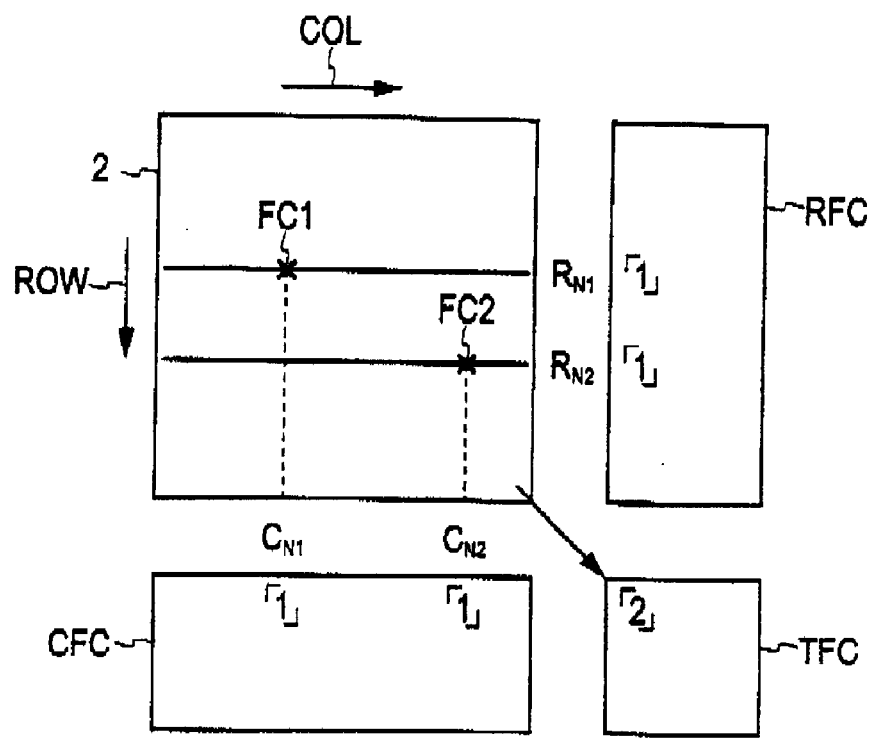
FIG. 3 is a diagram for explaining an example that failure memory cells are repaired by use of a method of analyzing a relief of failure cells in a memory according to the present invention.
FIG. 4 is a diagram for explaining the operation of a failure cell address memory shown in FIG. 2.
Figure 10:
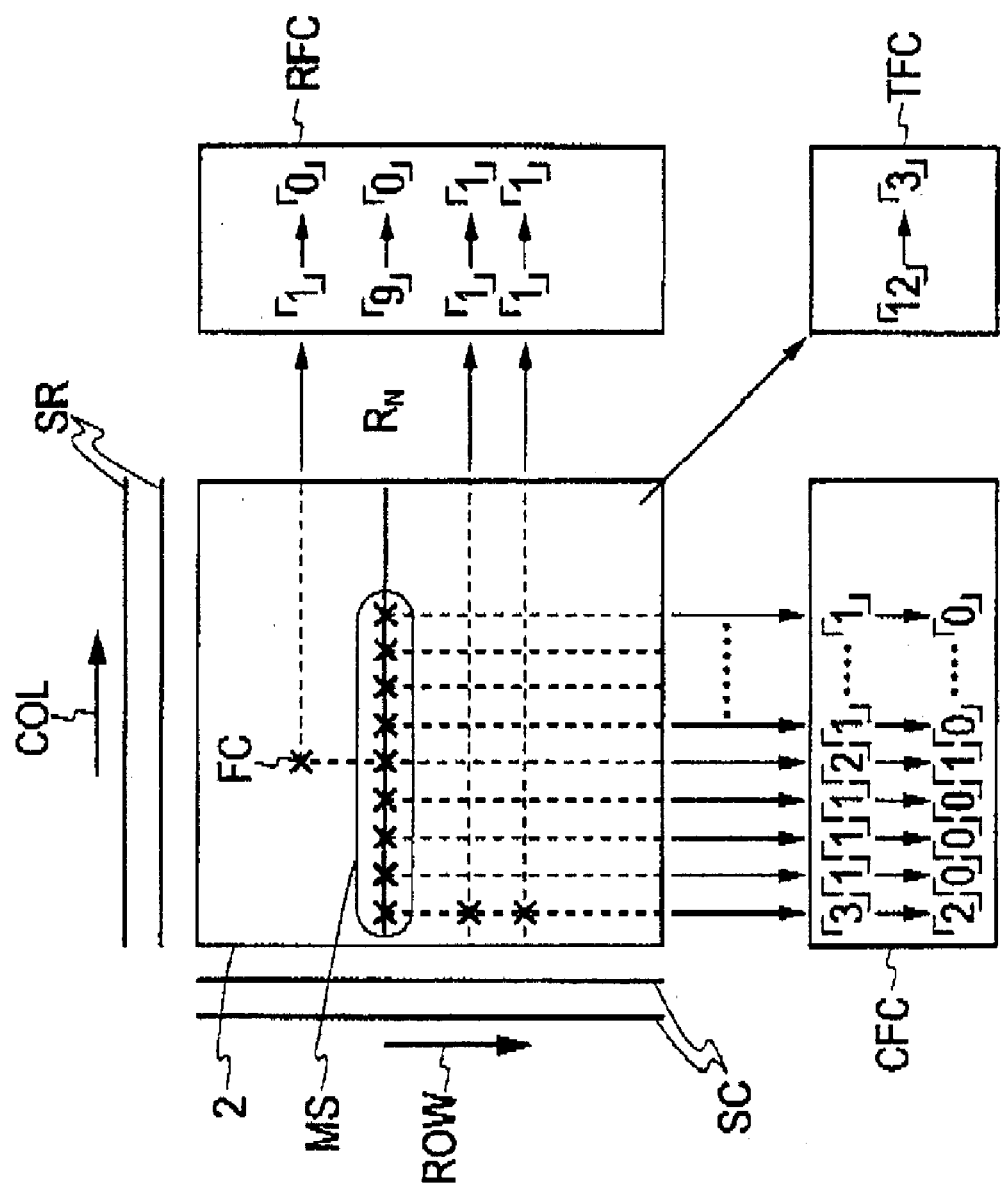
FIG. 10 is a diagram for explaining the change of the number of failure memory cells after the must-repair shown in FIG. 9 has been repaired.
Figure 11:
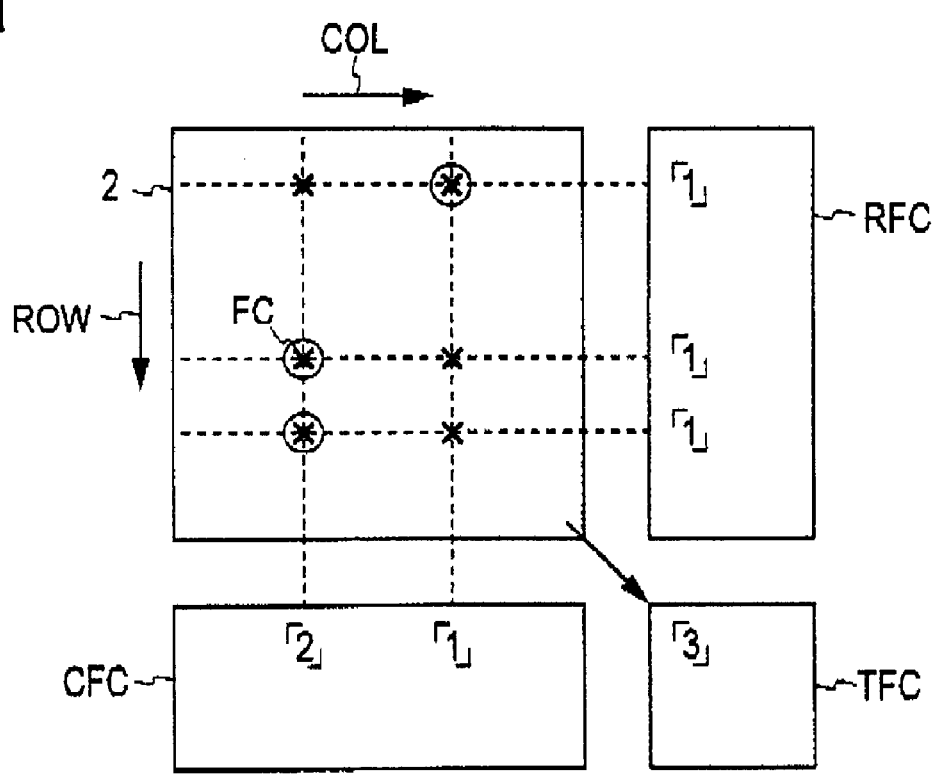
FIG. 11 is a diagram for explaining one of drawbacks of the prior art.

The operations of the controller CON, the failure line searching apparatus SEA, and the address scanning apparatus SCA will be discussed with reference to FIG. 3. The example shown in FIG. 3 is a case that one failure memory cell FC1 is present on a row address line at a row address $R_{N1}$ of the storage area 2, and one failure memory cell FC2 is present on a row address line at a row address $R_{N2}$ of the storage area 2, and column addresses of these failure memory cells FC1 and FC2 are $C_{N1}$ and $C_{N2}$. The two failure memory cells FC1 and FC2 are ones remaining after completion of the relief processing of a must-repair already described with reference to FIG. 10. In addition, the numbers of failure memory cells stored respectively in the row address failure number counter/memory RFC, the column address failure number counter/memory CFC, and the total failure number counter/memory TFC are their updated numerical values (numerical values representing the numbers of the failure memory cells FC1, FC2 shown in FIG. 3) after completion of the relief processing of a must-repair.

At first, the failure line searching apparatus SEA is started in its operation to increment the row address by one in the row address direction ROW, thereby to search whether a failure memory cell is present on each row address line or not. When the row address reaches $R_{N1}$ by this search operation in the row address direction, one failure memory cell FC1 is detected because the failure memory cell FC1 is present on this row address $R_{N1}$. Accordingly, at the position of this row address $R_{N1}$, the address scanning apparatus SCA is this time started in its operation to increment the column address by one in the column address direction COL, thereby to perform the operation of detecting a column address of the detected failure memory cell FC1. When the column address reaches $C_{N1}$ by this detecting operation of column address, the third zero detector ZO3 outputs from its non-inverting output terminal a logical H signal representing the fact that a read-out data from the column address failure number counter/memory CFC is not "0". At this time, if a read-out data from the failure analysis memory 118 is not "0", the fourth AND gate G4 outputs a logical H signal which is inputted into the controller CON as a control signal C-Fail Address representing a column address of the failure memory cell FC1. The controller CON outputs, when it receives the control signal C-Fail Address, a write signal WT. Accordingly, assuming that the search operation for failure memory cells mentioned above is being done as to the storage area A, in the failure cell address memory 125 are written the storage area address at which the failure memory cell FC1 is present, the row address RN, and the column address $C_{N1}$ of the failure memory cell FC1 and stored therein as shown in FIG. 4.

When the column address generator CAP generates its last address, the column address carry selector CY3 outputs a carry signal CAP MAX. The controller CON re-starts the failure line searching apparatus SEA when it receives the carry signal CAP MAX, and hence the failure line searching apparatus SEA resumes the search operation for failure memory cells in the row address direction ROW. When the row address reaches $R_{N2}$ by this search operation in the row address direction, one failure memory cell FC2 is detected because the failure memory cell FC2 is present on this row address $R_{N2}$. Accordingly, at the position of this row address $R_{N2}$, the address scanning apparatus SCA is started again in its operation to increment the column address by one in the column address direction COL, thereby to perform the operation of detecting a column address of the detected failure memory cell FC2. That is, the operation of the failure line searching apparatus SEA is temporarily stopped, and the address scanning apparatus SCA is started to detect a column address $C_{N2}$ of the detected failure memory cell FC2. When the column address $C_{N2}$ is detected, the third zero detector ZO3 outputs again from its non-inverting output terminal a logical H signal representing the fact that a read-out data from the column address failure number counter/memory CFC is not "0". At this time, if a read-out data from the failure analysis memory 118 is not "0", the fourth AND gate G4 outputs a logical H signal which is inputted into the controller CON as a control signal C-Fail Address representing a column address of the failure memory cell FC2. The controller CON outputs, when it receives the control signal C-Fail Address, a write signal WT. Accordingly, in the failure cell address memory 125 are written the storage area address A at which the failure memory cell FC2 is present, the row address $R_{N2}$ and the column address $C_{N2}$ Of the failure memory cell FC2 and stored therein as shown in FIG. 4.

When the writing operation has been completed, the controller re-starts the address scanning apparatus SCA. When the column address generator CAP generates its last address, the column address carry selector CY3 outputs a carry signal CAP MAX again. The controller CON re-starts the failure line searching apparatus SEA when it receives the carry signal CAP MAX, and hence the failure line searching apparatus SEA resumes the search operation for failure memory cells in the row address direction ROW. When the row address generator RAP generates its last address signal specifying the last row address by the search operation thereof, the row address carry selector CY2 outputs a carry signal RAP MAX and send it to the controller CON. The controller CON ends the operation of the failure relief analysis for that storage area when it receives the carry signal RAP MAX. Simultaneously therewith, the controller CON supplies a control signal TAP INC to the storage area address generator TAP to increment by one the address generated from the storage area address generator TAP so that the generator TAP outputs the storage area address signal specifying the next storage area and the operation of the failure relief analysis for that next storage area (in this case, the search operation of an address line on which a failure memory cell is present) will be performed.

During the time duration that the number of failure memory cells read out of the failure total number counter/memory TFC is "0", as already described, the storage area address generator TAP executes repeatedly the operation of incrementing the storage area address by one to continue reading out the failure total number counter/memory TFC. When the storage area address signal reaches the second last address with the condition that any numerical value other than "0" is not detected all the time, the storage area address carry selector CY1 outputs a carry signal TAP MAX to send it to the controller CON. The controller CON ends the operation of the failure relief analysis for that memory under test when it has received the carry signal TAP MAX.

As is apparent from the foregoing description, in this embodiment, when the failure line searching apparatus SEA detects a failure memory cell FC1 existing on an address line of, for example, a row address $R_{N1}$, the operation of the failure line searching apparatus SEA is temporarily stopped at the position of this row address $R_{N1}$, and the address scanning apparatus SCA performs at once the operation of detecting an column address $C_{N1}$ of the failure memory cell FC1 in the direction orthogonal to the row address line, thereby to detect the address of the detected failure memory cell FC1. Consequently, compared with the prior failure relief analyzing method described before, it is possible in this invention to specify an address of a failure memory cell in a short time. That is, in comparison with the prior failure relief analyzing method comprising the steps of: performing the search operation for all of failure memory cells in the row address direction to detect row addresses at each of which at least one failure memory cell is present; temporarily storing the detected row addresses in the main controller 111; performing the search operation for all of failure memory cells in the column address direction to detect column addresses at each of which at least one failure memory cell is present; temporarily storing the detected column addresses in the main controller 111; reading out the row addresses and the column addresses from the main controller 111, after all of the search operations for failure memory cells with respect to the row and column addresses thereof have been completed, to set them in the failure relief analyzer 120; and reading out the stored data of the failure analysis memory 118 to specify the addresses of the detected failure memory cells, the time period required for specifying addresses of failure memory cells can be remarkably decreased. As a result, the entire time duration required for performing the failure relief analysis can be considerably decreased.

In the above-mentioned embodiment, the controller CON first outputs a control signal R-SEARCH to start the failure line searching apparatus SEA, thereby to detects failure memory cells in the row address direction. However, it may be arranged that the controller CON first outputs a control signal C-SEARCH to start the failure line searching apparatus SEA, thereby to detect failure memory cells in the column address direction. In such case, the operation of the failure line searching apparatus SEA is temporarily stopped at the position of the column address of the detected column address line on which a failure memory cell is present, and the address scanning apparatus SCA performs at once the operation of detecting a row address of the failure memory cell in the direction orthogonal to the column address line, thereby to detect the address of the detected failure memory cell. Further, such setting can be made by setting the necessary data in setting means provided in the controller CON.

According to the present invention, there can be provided a method of analyzing a relief of failure cells and a failure relief analyzer that can specify in short time an address of a failure memory cell. In addition, if the failure relief analyzer constructed as mentioned above is incorporated in a memory testing apparatus, the testing time of an entire memory can be decreased.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present invention. Accordingly, it should be understood that the present invention is not limited to the illustrated embodiments, and is intended to encompass all such modifications, alterations, changes, and/or minor improvements falling within the scope of the invention defined by the appended claims.

What is claimed is:

1. A method of analyzing a repair of failure cell in a memory comprising the steps of:

testing a memory having a plurality of storage areas and a plurality of spare lines for relieving failures in said storage areas, and storing in a failure memory cell storage an indication of failure memory cells in the storage areas;

counting for each of the storage areas a number of failure memory cells for each row address, a number of failure memory cells for each column address, and a total number of failure memory cells by accessing each memory cell of the failure memory cell storage once;

storing the counted numbers as stored data;

detecting a must-repair;

updating, after a must-repair has been detected, the stored data and the number of spare lines available for relieving a failure to ones after the detected must-repair has been repaired to show said must-repair has been repaired;

searching the updated stored data to determine whether any failure memory cell is present or not for each row address or each column address of each of the storage areas;

temporarily stopping, each time a failure memory cell is detected, the searching of failure memory cells for each row address or each column address and searching a column address or row address of the detected failure memory cell;

temporarily stopping, when a column address or row address of the failure memory cell is detected, the searching of a column address or row address of the detected failure memory cell and storing the address of the storage area at which the detected failure memory cell exists, the row address and the column address of the detected failure memory cell;

resuming, after the address of the storage area at which the detected failure memory cell exists, the row address and the column address of the detected failure memory cell have been stored, the searching of a column address or row address; and resuming, when the searching of a column address or row address has been ended, the searching of failure memory cells for each row address or each column address.

2. A memory testing apparatus for testing a memory having a plurality of storage areas and a plurality of spare lines for relieving failures in said storage areas, and storing in a failure memory cell storage of a failure relief analyzer an indication of failure memory cells in the storage areas, said failure relief analyzer comprising:

means for counting, for each of the storage areas, a number of failure memory cells for each row address, a number of failure memory cells for each column address, and a total number of failure memory cells by accessing each memory cell of the failure memory cell storage once;

a failure memory cell number storage that stores the counted numbers as stored data;

a spare line number memory for storing a number of spare lines available for repair, said spare line number memory storing for each storage area a number of spare lines provided in row address direction and a number of spare lines provided in column address direction;

data updating apparatus for carrying out, each time a must-repair is detected, a process of updating the stored data and the number of spare lines to ones after the must-repair has been detected to show said must-repair has been repaired;

an analyzed storage area detector for searching the updated stored data whether a failure memory cell exists or not in each storage area and for determining whether a respective storage area is a storage area for which a failure relief analysis should be performed;

a failure line searching apparatus for searching, in the storage area where said analyzed storage area detector has determined that a failure relief analysis should be performed, whether a failure memory cell exists or not in each row address or column address;

an address scanning apparatus started when said failure line searching apparatus detects a row address or column address where a failure memory cell exists, and for detecting a column address or row address of the detected failure memory cell;

a failure cell address memory for storing the address of the failure memory cell detected by said failure line searching apparatus and said address scanning apparatus and the address of the storage area at which the detected failure memory cell exists; and a controller for controlling to temporarily stop, when the failure line searching apparatus has detected a row address or column address where a failure memory cell exists, the address searching for the failure memory cell by the failure line searching apparatus and to operate the address scanning apparatus; to temporarily stop, when the address scanning apparatus has detected a column address or row address of the detected failure memory cell, the column address or row address searching by the address scanning apparatus; to store in the failure cell address memory the address of the failure memory cell detected by the failure line searching apparatus and the address scanning apparatus and the address of the storage area at which the detected failure memory cell exists; to resume, after the row address and the column address of the failure memory cell and the address of the storage area at which the failure memory cell exists have been stored, the column address or row address searching by the address scanning apparatus; and to resume, when the column address or row address searching has been ended, the address searching for the failure memory cell by the failure line searching apparatus.

3. The memory testing apparatus as set forth in claim 2, wherein said analyzed storage area detector of said failure relief analyzer comprises:

a storage area address generator for generating addresses given respectively to said plurality of storage areas constituting the memory under test;

a total failure number counter/memory accessed by storage area address signals outputted from said storage area address generator and for storing the total number of failure memory cells for each storage area;

zero detector for detecting the fact that the total number of failure memory cells read out of said total failure number counter/memory is "0" or a numerical value other than "0".

4. The memory testing apparatus as set forth in claim 2, wherein said failure line searching apparatus of said failure relief analyzer comprises:

a row address generator or column address generator for generating row addresses or column addresses on each of the storage areas;

a row address failure number counter/memory or column address failure number counter/memory for storing the number of failure memory cells on each row address line or each column address line for each storage area;

zero detector for detecting whether the number of failure memory cells read out of either one of said row address failure number counter/memory or column address failure number counter/memory is "0" or a numerical value other than "0"; and means of starting the operation of said address scanning apparatus each time said zero detector detects a numerical value other than "0".

5. The memory testing apparatus as set forth in claim 2, wherein said address scanning apparatus of said failure relief analyzer comprises:

a column address generator or row address generator for generating column addresses or row addresses on each of the storage areas;

a column address failure number counter/memory or row address failure number counter/memory for storing the number of failure memory cells on each column address line or each row address line for each storage area;

zero detector for detecting whether the number of failure memory cells read out of either one of said column address failure number counter/memory or row address failure number counter/memory is "0" or a numerical value other than "0"; and writing control means for causing addresses to be stored in said failure cell address memory, said addresses being specified by address signals generated respectively from said storage area address generator, said row address generator and said column address generator, each time said zero detector detects a numerical value other than "0" and at the same time a read-out data of a failure analysis memory provided in the memory testing apparatus is "fail".

* * * * *